United States Patent [19]

Broadbent

[11] Patent Number: 5,505,633
[45] Date of Patent: Apr. 9, 1996

[54] INTEGRAL EXTERNAL CONNECTOR INTERFACE FOR THIN FORM FACTOR COMPUTER CARDS

[75] Inventor: Neal E. Broadbent, El Dorado Hills, Calif.

[73] Assignee: Intel Corporation, Santa Clara, Calif.

[21] Appl. No.: 243,228

[22] Filed: May 13, 1994

[51] Int. Cl.⁶ .............................. H01R 9/09; H05K 7/10
[52] U.S. Cl. ..................... 439/329; 361/686; 439/946
[58] Field of Search ..................... 439/55, 329, 344, 439/676, 946; 361/760, 686, 737

[56] References Cited

U.S. PATENT DOCUMENTS

| | | | |
|---|---|---|---|
| 5,183,404 | 2/1993 | Aldous et al. | 439/676 |
| 5,336,099 | 8/1994 | Aldous et al. | 439/131 |
| 5,338,210 | 8/1994 | Beckham et al. | 439/344 |
| 5,395,268 | 3/1995 | Okada | 439/676 |

OTHER PUBLICATIONS

No author, *PCMCIA, Personal Computer Memory Card International Association PC Card Standard, Release 2.0*, 3–13 through 3–26 (Sep. 1991).

No author, *PCMCIA Recommended Extensions, Release 1.00*, 1–3 through 1–8 (1992).

*Primary Examiner*—Neil Abrams
*Attorney, Agent, or Firm*—Blakely, Sokoloff, Taylor & Zafman

[57] ABSTRACT

A method and apparatus for providing a mated communications receptacle for coupling a standard communications plug to a computer system is described. The method and apparatus includes using an IC card which forms at its rear edge a first communications receptacle half. The method and apparatus also includes using an IC card receptacle which forms a second communications receptacle half along one of its slot edges. When the IC card is inserted into the IC card receptacle, the first communications receptacle half of the IC card becomes located opposite the second communications receptacle half of the IC card receptacle, and a full communications receptacle is formed for coupling to the standard communications plug.

12 Claims, 5 Drawing Sheets

INTEGRAL EXTERNAL CONNECTOR INTERFACE FOR THIN FORM FACTOR COMPUTER CARDS

CROSS-REFERENCE TO RELATED APPLICATIONS

The following co-pending U.S. patent applications relate to the present application. Each of the listed co-pending applications are assigned to the same assignee as the present application.

1) U.S. patent application Ser. No. 08/009,133, filed Jan. 26, 1993, and titled, "METHOD AND APPARATUS FOR PROPAGATING SIGNALS ON INTEGRATED CIRCUIT CARDS"
2) U.S. patent application Ser. No. 08/249,290, filed May 26, 1994, and titled, "MODULAR COMMUNICATIONS CONNECTOR FOR I/O CARD APPLICATIONS"
3) U.S. patent application Ser. No. 08/241,722, Filed May 12, 1994, and titled, "INTERCONNECTION SCHEME FOR INTEGRATED CIRCUIT CARD WITH AUXILIARY CONTACTS"
4) U.S. patent application Ser. No. 08/234,481, Filed Apr. 28, 1994, and titled, "KEYING NOTCHES FOR SIDE CONTACTS ON A THIN FORM FACTOR COMPUTER CARD"

FIELD OF THE INVENTION

The present invention relates to the field of portable computers and their associated peripheral devices. Particularly, the present invention relates to an integral external connector interface for allowing the coupling of an external communications plug to a portable computer system which utilizes peripheral devices embodied on credit-card integrated circuit (IC) cards.

BACKGROUND OF THE INVENTION

Portable computers have recently become more powerful while at the same time becoming lighter and smaller. Peripheral devices are often used in conjunction with the portable computer to provide increased functionality, such as communications ability or enhanced data storage. One example of a peripheral device is a modem, which allows a user of a portable computer to communicate with other computers using telephone lines. Reduction in the size of peripheral devices has accompanied reductions in the size of portable computers.

Some portable computer systems and peripheral devices, modems in particular, have been designed recently such that the peripheral device is contained on a thin form factor computer card which plugs into a socket recessed within the body of the computer. Such peripheral devices can be carried along with the portable computer and inserted when needed.

A standard for the thin form factor computer cards which defines the physical and electrical interface specifications for the interchangeability of memory and input/output cards was introduced by the Personal Computer Memory Card International Association (PCMCIA) jointly with the Japanese Electrical Industry Association (JEIDA) in Sep. 1991. In addition, a specification referred to as an Exchangeable Card Architecture (ExCA) specification, dated Dec. 20, 1991, has been issued by Intel Corporation of Santa Clara, Calif. A socket designed to these specifications allows cards, such as modem and flash memories, to be inserted, used, and removed interchangeably in the same socket. The computer systems used typically contained at least one socket recessed within the computer, such that the inserted computer card containing the modem, flash memory, etc., is protected by the body of the computer surrounding the socket in which the components are coupled.

The PCMCIA specification provides that the personal computer cards have a 68-pin connector located at the end of the card for transmitting signals between the computer and the card. However, many system manufacturers desire to connect to critical signals on the integrated circuit card which are not available through the 68-pin connector. One example of such a need is found when the computer card is a modem card, in which case "tip" and "ring" connections between the modem card and the external telephone network are needed.

The needed external communications connection described above has typically been achieved through the use of a second connector located along the rear edge of the computer card, i.e. the edge which faces to the outside of the computer which the card is inserted. This rear edge is opposite the 68-pin standard interface. One method currently employed in the art uses a 14-pin standard rear interface connector together with a separate line adapter module (LAM) which, in turn, plugs into a standard RJ11 wall jack. The user plugs the LAM into the rear of the inserted modem card, and then plugs the LAM into the RJ11 wall jack.

Another method currently employed in the art, which obviates the need for the user to carry a line adapter module around with the modem card, is for the computer card to include a retractable connector tab located at the rear edge of the card. The retractable connector tab is manually extended from the body of the modem card after the card is inserted into the computer. The user then plugs a male RJ11 plug directly into the horizontally-extending retractable connector tab. The name XJACK(™) has been used to identify this method.

There are problems and deficiencies, however, with the above methods employed to establish an external communications connection to the inserted IC card. A problem with the LAM method is, of course, the need for the user to carry around a separate interface device (the LAM) with the modem card. The retractable connector tab method, while obviating the need for the adapter, brings about a mechanical stability/durability deficiency. Specifically, when the modem card is inserted and connected, the retractable connector tab protrudes out of the body of the modem card and away from the chassis of the computer, and is thus subject to disturbance or damage from objects brushing up against the side of the computer in the work environment. Additionally, however, the retractable connector method involves the inclusion of one or more user-movable parts into the modem card, which inherently increases complexity and cost in the design and manufacture of the modem card.

Thus, in establishing an external communications connection to an inserted IC card using the currently known methods, there are user convenience problems in carrying around separate interface devices or, alternatively, mechanical stability/durability problems with retractable connector tabs built in to the IC card frames.

SUMMARY OF THE INVENTION

It is thus an object of the present invention to provide for an external communications connection to the inserted card.

It is another object of the present invention to obviate the need for an adapter cord to achieve a coupling between the inserted IC card and a standard external communications plug.

It is yet another object of the present invention to achieve a connection apparatus which provides for protection of the external connector using the body of the IC card and the computer's IC card receptacle.

It is yet another object of the present invention to achieve the external connection apparatus in a way which does not involve user-movable parts on the frame of the computer IC card.

These and other objects of the present invention are provided for by an integral external connector interface for coupling a standard communications plug to a computer system. The present invention is provided for use in a computer system which is capable of use with removable insertable integrated circuit (IC) cards, and for use where the standard communications plug has a first physical portion and a second physical portion, the first physical portion having electrical contacts, the second physical portion having mechanical securing capability to a corresponding standard communications receptacle, the corresponding standard communications receptacle likewise having a first physical portion for coupling to the first physical portion of the standard communications plug, and a second physical portion for coupling to the second physical portion of the standard communications plug. The present invention includes an IC card comprising a frame which defines at a first location a first receptacle half which is substantially similar to the first physical portion of the corresponding standard communications receptacle. The present invention also includes an IC card receptacle mechanically affixed to the chassis of the computer system, the IC card receptacle comprising an outer wall, the outer wall comprising slot edges defining a slot for passing the IC card into the IC card receptacle, wherein one of the slot edges is formed so as to also define a second receptacle half which is substantially similar to the second physical portion of the corresponding standard communications receptacle. Upon a full insertion of the IC card into the IC card receptacle, the first receptacle half of the IC card locates adjacent to the second receptacle half of the IC card receptacle, such that the first receptacle half and the second receptacle half together form a mated receptacle capable of coupling to the standard communications plug.

BRIEF DESCRIPTION OF THE DRAWINGS

FIG. 4A shows a more detailed view of a half-receptacle formed near the rear edge of a modem IC card.

DETAILED DESCRIPTION OF THE PRESENT INVENTION

A method and apparatus for an integral external communications connector for coupling a standard communications plug to a computer system is now described. In the following description, numerous details are set forth such as specific types of external communications plugs, specific numbers of pins and electrical contacts, sizes of receptacles, types of computer card applications, etc., in order to provide a thorough understanding of the present invention. It will be apparent, however, to one skilled in the art that the present invention may be practiced without these specific details. In other instances, well-known structures and devices are shown in block diagram form, rather than in detail, in order to avoid unnecessarily obscuring the present invention.

Figure 1:
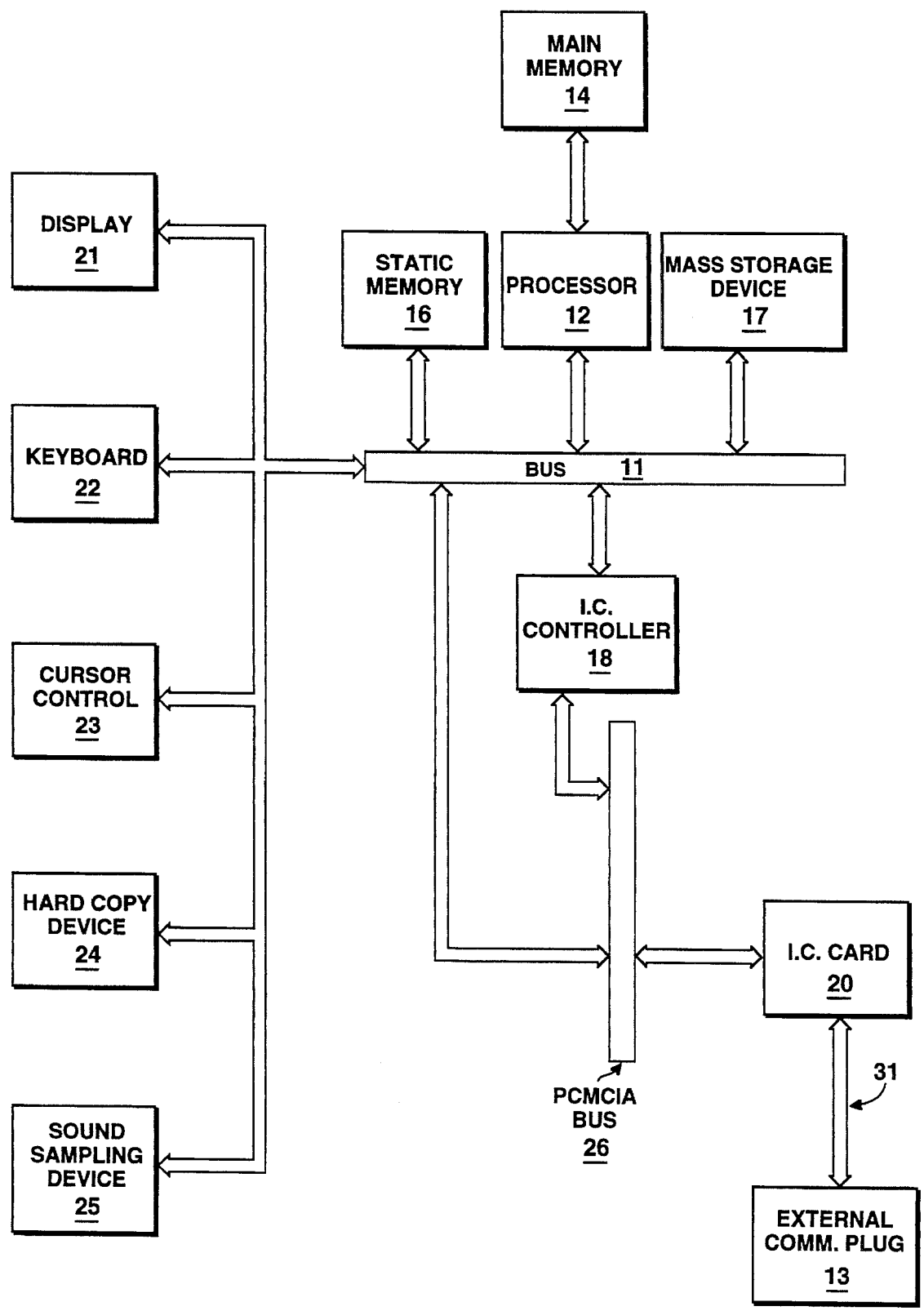
FIG. 1 illustrates a block diagram of a computer system designed for use with removably insertable integrated circuit cards.

FIG. 1 shows a block diagram of a computer system in which the present invention is advantageously employed. The computer system as may be utilized with the preferred embodiment of the present invention generally comprises a bus for communication means 11 for communicating information, processing means 12 coupled to bus 11 for processing information, a random access memory (RAM) or other dynamic storage device 14 coupled with processing means 12 for storing information and instructions for processing means 12, a read only memory (ROM) or other non-volatile storage device 16 coupled with bus 11 for storing non-volatile information and instructions for processing means 12, a data storage device 17, such as a magnetic disk or disk drive, coupled with bus 11 for storing information and instructions, a display device 21, such as a cathode ray tube, liquid crystal display, etc., coupled to bus 11 for displaying information to the computer user, an alphanumeric input device 22 including alpha-numeric and other keys, etc., coupled to bus 11 for communicating information and command selections to processor 12, a cursor control 23 coupled to bus 11 for controlling cursor movement, a hard copy device 24, such as a plotter of printer, for providing visual representation of the computer images, hard copy device 24 being coupled with processor 12, main memory 14, non-volatile storage device 16 and mass storage device 17 through bus 11, and a sound recording and playback device 25 coupled to bus 11 for providing audio recording and playback.

Integrated circuit card 20 is included for use with the computer system and is coupled to PCMCIA bus 26. Note that although the computer system only shows only one IC card, the number of IC cards which may be coupled to the computer system may vary. In the currently preferred embodiment, IC card 20 is a PCMCIA card. PCMCIA bus 26 is coupled to bus 11 and to integrated circuit (IC) controller 18 for providing communication information between IC card 20 and the remainder of the computer system. In the currently preferred embodiment, PCMCIA bus 26 is a standard PCMCIA bus for communicating information according to the PCMCIA standard. Note that although IC card 20 and PCMCIA bus 26 of the present invention communicate according to the PCMCIA standard, other interface types and configurations fall within the scope of the present invention. IC controller 18 provides control and address information to IC card 20 via PCMCIA bus 26 and is coupled to bus 11. Also note that although the IC card 20 is shown coupled to PCMCIA bus 26, in the currently preferred embodiment the card is not coupled to PCMCIA bus 26 until it is inserted into an IC card receptacle in the side of the computer, such that its standard primary interface (e.g., the 68 pin PCMCIA standard interface) is mated with the interface pins (e.g., the 68 pins) of the IC card receptacle of the computer system.

FIG. 1 also shows a signal path 31 coupling IC card 20 to an external communications plug 13. The external communications plug 13 comprises a standard communications plug such as an RJ11 plug or RJ45 plug, and is coupled to a communications network, not shown in FIG. 1, such as the telephone network in the case of a modem card application. In the embodiment of the invention described, IC card 20 represents a modem card, and thus the signal path 31 represents tip and ring signals. The present invention relates to the: physical and electrical coupling of the external communications plug 13 to the IC card 20 to achieve the signal path 31.

It is noted that while the examples RJ11 and RJ45 are used above to describe the external communications plug 13, the external communications plug 13 can be any of a variety of standardized communications plugs which comprise electrical contacts along a first surface and mechanical securing means along a second surface. Additionally, the IC card 20 can be other than a modem card, such as a wireless communications card, in which case the external communications plug 13 could be providing, for example, radiofrequency antenna signals to the IC card 20.

Of course certain implementations and uses of the present invention may not require that the computer system include all of the above components. For example, in certain implementations a keyboard and cursor control device for inputting information to the system may not be required. In other implementations, it may not be required to provide a display device for displaying information. Also, some components may be coupled in other configurations. For instance, main memory 14 may be coupled directly to bus 11 instead of being coupled to processor 12 directly.

Figure 2:
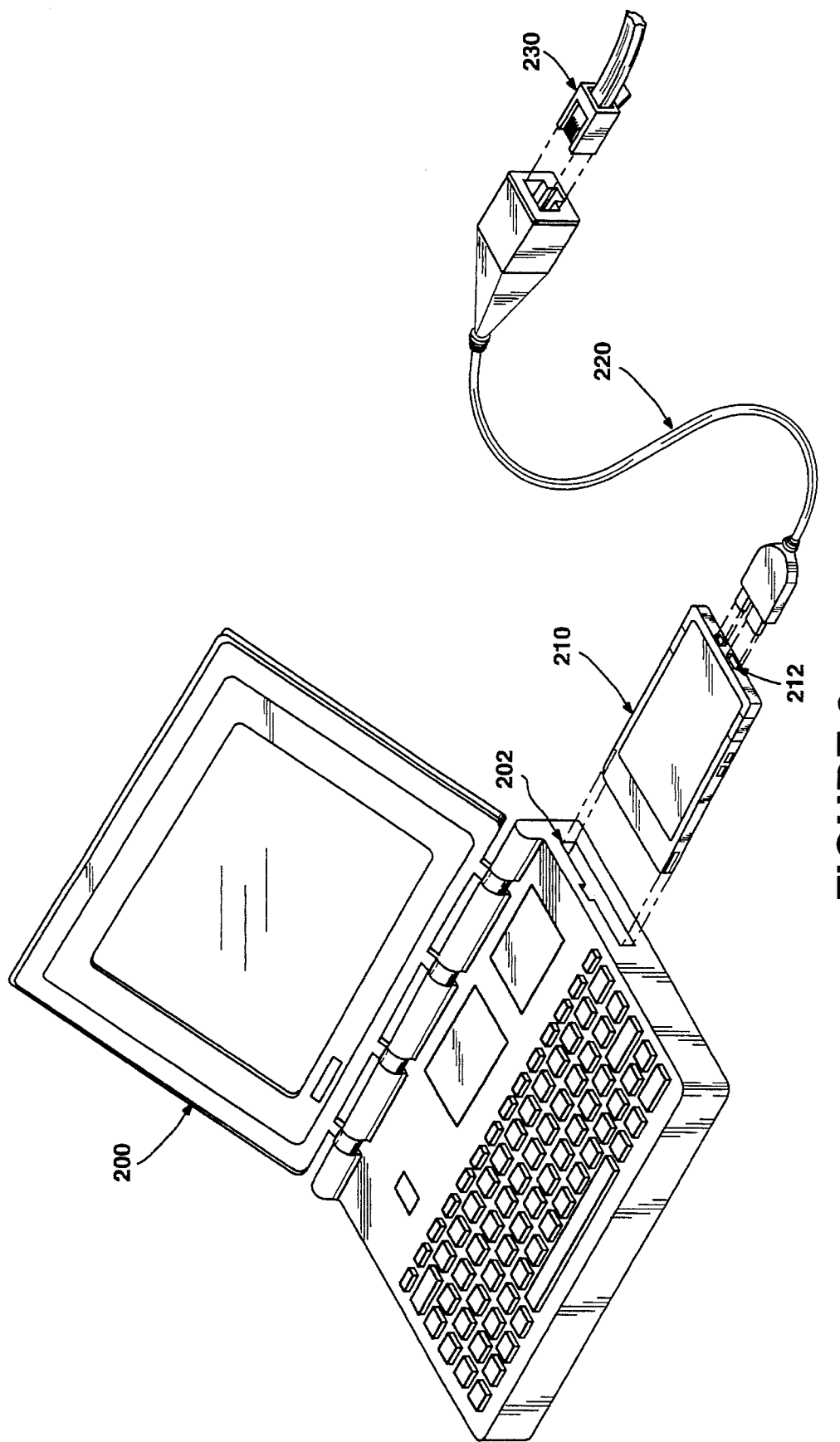
FIG. 2 illustrates a portable computer system with a modem IC card using a rear 14-pin connector and line adapter module to receive external tip and ring signals according to the prior art.

FIG. 2 illustrates a portable computer system with a modem IC card which uses a rear 14-pin connector and a line adapter module to receive external tip and ring signals according to the prior art. FIG. 2 shows the computer chassis 200 which includes an IC card receptacle 202, into which is inserted a modem IC card 210 including rear 14-pin connector 212. A line adapter module (LAM) 220 is also shown, which serves as an adapter between an RJ11 plug 230 and the rear 14-pin connector 212. The prior art configuration of FIG. 2 has an interent disadvantage to the user because there is a need for the user to carry around a separate interface device (LAM 220) with the modem card in order to connect to the standard RJ11 plug 230.

Figure 3:
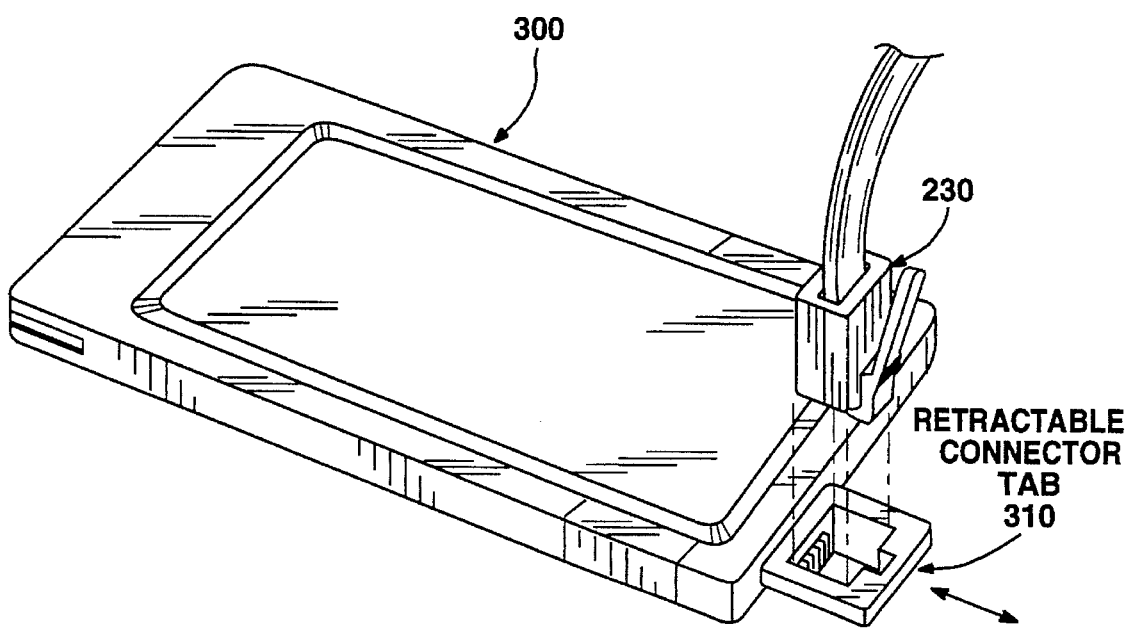
FIG. 3 illustrates a modem IC card using a retractable connector tab to achieve connection with external tip and ring signals according to the prior art.

FIG. 3 shows a modem IC card using a retractable connector tab to achieve connection with external tip and ring signals according to the prior art. Shown in FIG. 3 is a modem IC card 300 which is insertable into the IC card receptacle 202 of FIG. 2. The modem IC card 300 has a retractable connector tab 310, which is shown in FIG. 3 in the extended position. The RJ11 jack 230 is inserted vertically into the extended connector tab. A disadvantage of this configuration is that when the modem card is inserted and connected, the retractable connector tab 310 protrudes out of the body of the modem card and away from the chassis of the computer, and thus is subject to disturbance or damage from objects brushing up against the side of the computer in the work environment. Additionally, however, the modem IC card 300 containing the retractable connector tab 310 necessarily involves the inclusion of one or more user-movable parts which results in an undesirable increased cost and complexity in the design and manufacture of the modem card.

It has been found that an effective external connector for a standard communications plug such as an RJ11 plug does not need to be unitarily contained in any single system component, but may be embodied in separate parts into pre-existing components which may then be brought together to form a complete, functional female receptacle. The present invention employs this concept by providing a first portion of a female RJ11 receptacle along the rear edge of a modem IC card, and by providing a second portion of a female RJ11 receptacle along a slot edge of the IC card receptacle, such that when the IC card is inserted into the IC card receptacle, a functional female RJ11 receptacle is formed. Because it is the modem IC card which requires the electrical connections to the external tip and ring source, the first portion of the female RJ11 receptacle along the rear edge of the modem IC card must necessarily form the portion of a standard female RJ11 receptacle which contains the electrical contacts.

It has been found that through the use of this concept, an RJ11 connection may be formed by simply (1) inserting the modem IC card modified in accordance with the present invention into the IC card receptacle modified in accordance with the present invention, thus forming an RJ11 receptacle, and (2) plugging the external RJ11 jack into the formed RJ11 receptacle. As such, then, an external connection is achieved without the need for a LAM adapter cord and without the need for a retractable connector tab and its associated problems.

Figure 4:
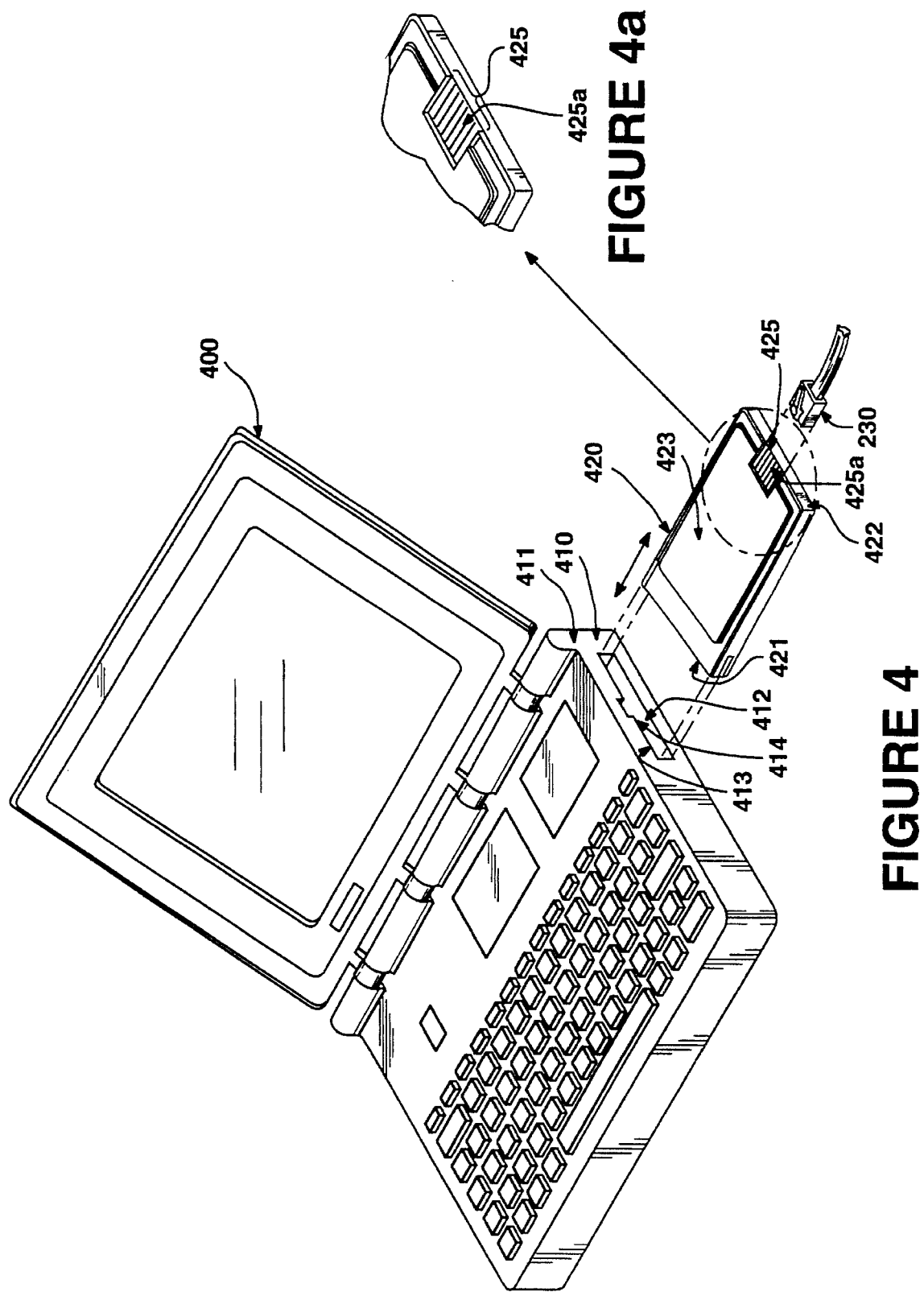
FIG. 4 shows a portable computer system with an integral external connector interface in accordance with the present invention.

FIG. 4 shows a portable computer system with an integral external connector interface in accordance with a first embodiment of the present invention. FIG. 4 illustrates a computer chassis 400, the computer chassis 400 including an IC card receptacle 410. In FIG. 4 the IC card receptacle 410 is mechanically affixed to and integral with the computer chassis 400, comprising a region of the computer chassis 400. The IC receptacle 410 comprises an outer wall 411, shown simply as a region around a slot 412 for receiving IC cards. Slot 412 is defined by a series of slot edges including an upper slot edge 413. The upper slot edge 413, in addition to forming the upper edge of the slot 412, also forms a relief notch 414. The relief notch 414, in the present embodiment, serves as the second (i.e. non-electrical) portion of the standard RJ11 female receptacle to be formed when the appropriate IC card is inserted. Such an appropriate IC card is a modem IC card 420 shown in FIG. 4.

Modem IC card 420 comprises an integral half-receptacle in accordance with the first embodiment of the present invention. Modem IC card 420 includes a first edge 421 which contains a primary 68-pin PCMCIA interface, and a second edge 422 at the rear of the modem IC card 420. The modem IC card 420 also includes a surface 423 which extends from the first edge 421 to the second edge 422. As shown in FIG. 4, the surface 423 forms an integral half-receptacle 425 at a location near the edge 422. The integral half-receptacle 425 includes electrical contacts 425a, which serve as external communications contacts for the IC card 420. Finally, FIG. 4 shows the standard RJ11 plug 230.

FIG. 4A shows in greater detail the half-receptacle 425 of the modem IC card 420. A key aspect of the present invention is that the half-receptacle 425 is formed by a recessed groove in the surface 423, and takes substantially the same shape as a first physical portion of a standard female RJ11 receptacle, the first physical portion being defined here as the portion which contains the electrical contacts. Thus, the half-receptacle 425 is integral with the body of the modem IC card 420. The electrical contacts 425a are electrically coupled to circuitry on the modem IC card 420, circuitry whose specific details are not an important feature of the present invention and thus are omitted from FIG. 4.

It is important to note that the surface 423 represents the upper surface of the IC card 420 but is not required to be of unitary mechanical and electrical construction in forming the half-receptacle 425. For example, the RJ11 electrical contacts 425a may be located on a circuit board underlying plane of the surface 423, while recessed grooves in the surface 423 may be formed around the electrical contacts so as to form appropriate contours which lead to the electrical contacts 425a, to give the overall form of the electrically-contacting portion of a female RJ11 receptacle. Methods which can be used to form the half-receptacle 425 into the modem IC card 420 are known in the art.

It is also noted that the methods used to form the relief notch 414 (i.e. the second, non-electrically-conducting, portion of the standard female RJ11 receptacle) are known in the art. In the present embodiment of the invention the relief notch 414 takes the shape of the relief notch of a standard RJ11 receptacle. However, in other embodiments of the invention a relief notch corresponding to relief notch 414 in FIG. 4 may take a substantially more complex shape as needed to accommodate a different type of mechanical securing means of a different standard communications plug, such complex shapes not being outside the scope of the present invention.

Figure 5:
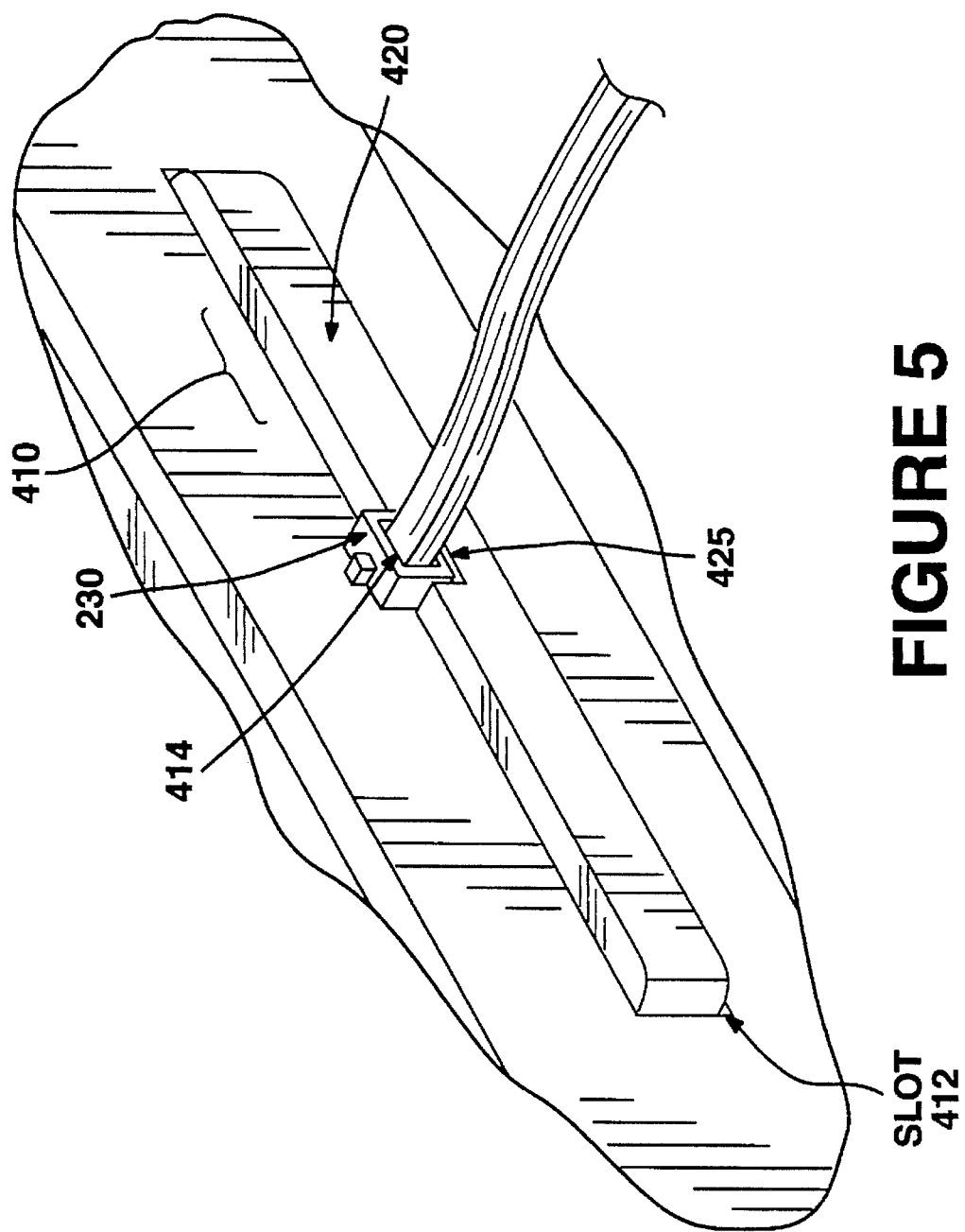
FIG. 5 illustrates the integral external connector interface of FIG. 4 with the components brought together and coupled to a standard external communications plug.

FIG. 5 illustrates the integral external connector interface of FIG. 4 with its components brought together and coupled to a standard RJ11 plug. As shown in FIG. 5, a device constructed in accordance with the present invention is used as follows: (1) modem IC card 420 is inserted into slot 412 of IC card receptacle 410, and (2) an external RJ11 plug 230 carrying the needed tip and ring signals is inserted into the effective RJ11 receptacle formed by the half-receptacle 425 and the relief notch 414. The effective receptacle, formed from the mated receptacle halves, houses a substantial portion of the body of the RJ11 plug 230, thus forming a mechanically stable connection and protecting the plug and the connection from objects brushing up against the side of the computer 400. As is evident from FIG. 5, the user is spared the need for adapter hardware to connect to the RJ11 plug, and also the user is spared the extra step of pulling out a retractable connector tab before coupling the RJ11 plug to the modem IC card 420.

Thus, a method and apparatus for an integral external communications connector for coupling a standard external communications plug to a computer system has been described. Whereas many alterations and applications of the present invention will no doubt become apparent to a person of ordinary skill in the art after reading the foregoing description, it is understood that the particular embodiments shown and described by illustration are in no way intended to be limiting. Therefore, references to details of the preferred embodiments are not intended to limit the scope of the claims which themselves recite only those features regarded as essential to the invention.

What is claimed is:

1. A method of forming an external communications connection between a computer system and an external device having a standard communications plug, said standard communications plug being manufactured for coupling to a corresponding standard communications receptacle, said standard communications receptacle having a first physical portion which is electrically-contacting, said standard communications receptacle having a second portion which is non-electrically-contacting, said method comprising the steps of:

inserting a thin form factor integrated circuit (IC) card which forms a first receptacle half substantially similar to the first physical portion of the standard communications receptacle into an integrated circuit (IC) card receptacle which forms a second receptacle half substantially similar to the second portion of the standard communications receptacle, such that the first receptacle half of the IC card and the second receptacle half of the IC card receptacle align so as to form a mated receptacle capable of receiving the standard communications plug; and inserting the standard communications plug into the mated receptacle.

2. The method of forming an external communications connection between a computer system and an external device coupled to an standard communications plug according to claim 1, wherein the standard communications plug is an RJ11 plug, and wherein the standard communications receptacle is an RJ11 jack.

3. The method of forming an external communications connection between a computer system and an external device coupled to an standard communications plug according to claim 1, wherein the standard communications plug is an RJ45 plug, and wherein the standard communications receptacle is an RJ45 jack.

4. The method of forming an external communications connection between a computer system and an external device coupled to an standard communications plug according to claim 2, wherein the thin form factor IC card is a PCMCIA card.

5. The method of forming an external communications connection between a computer system and an external device coupled to an standard communications plug according to claim 3, wherein the thin form factor IC card is a PCMCIA card.

6. A mating receptacle apparatus for coupling a standard communications plug to a corresponding standard communications receptacle on a computer system having removably insertable integrated circuit (IC) cards, the standard communications plug including a first physical portion having electrical contacts for electrical and mechanical mating with a first physical portion of the corresponding standard communications receptacle, and a second physical portion substantially corresponding to a second physical portion of the standard corresponding communications receptacle for mechanical mating, the mating receptacle apparatus comprising:

an integrated circuit (IC) card comprising a frame defining a first receptacle half substantially similar to the first physical portion of the corresponding standard communications receptacle; and an IC card receptacle mechanically affixed and integral with a chassis of the computer system, the IC card receptacle comprising an outer wall having slot edges defining a slot for fully inserting the IC card into the IC card receptacle wherein a one of said slot edges is formed so as to also define a second receptacle half; the first receptacle half of the IC card located adjacent to the second receptacle half of the IC card receptacle, the first receptacle half and the second receptacle half together forming a mated receptacle capable of coupling to the standard communications plug.

7. The mating receptacle apparatus of claim 6, wherein the IC card further comprises:

a first edge having a primary connector for transferring a plurality of signals between the IC card and the computer system;

a second edge;

a first surface generally planar and extending from the first edge to the second edge, the first surface forming a recessed groove near the location of the second edge, the recessed groove having a width corresponding to a width of the first surface of the external communications plug; and an external communications contact for transferring at least one signal between the IC card and the external communications plug, the external communications contact being positioned within the recessed groove of the first surface of the IC card for establishing an electrical connection between the external communications contact and the electrical contact of the external communications plug upon placement of a portion of the first surface of the external communications plug within the recessed groove of the first surface of the IC card.

8. The mating receptacle apparatus of claim 7, wherein the IC card receptacle further comprises:

a primary electrical interface for achieving a coupling of a primary connector of the IC card to the computer system upon insertion of the IC card into the IC card receptacle; and a generally-planar outer wall, the generally-planar outer wall including slot edges defining a slot for allowing passage of the IC card into the IC card receptacle, the slot edges including a first slot edge having a width corresponding to an overall width of the IC card, the first slot edge further defining a relief notch capable of receiving the second surface of the external communications plug wherein upon a full insertion of the IC card into the IC card receptacle, the recessed groove of the first surface of the IC card is located substantially opposite the relief notch of the first slot edge of the wall of the IC card receptacle, forming an effective external communications plug receptacle by the combination of (1) the recessed groove of the first surface of the IC card, (2) the external communications contact of the IC card, (3) the first slot edge, and (4) the relief notch.

9. The mating receptacle apparatus of claim 8, wherein the standard communications plug is an RJ11 plug, and wherein the standard communications receptacle is an RJ11 jack.

10. The mating receptacle apparatus of claim 8, wherein the standard communications plug is an RJ45 plug, and wherein the standard communications receptacle is an RJ45 jack.

11. The mating receptacle apparatus of claim 8, wherein the recessed groove formed by the first surface of the IC card forms the electrically-contacting half of a standardized telephone jack selected from the group: RJ11, RJ45.

12. The mating receptacle apparatus of claim 8, wherein the IC card is a PCMCIA card.

\* \* \* \* \*